(12) United States Patent  
Aprile et al.

(10) Patent No.: US 7,779,889 B2  
(45) Date of Patent: Aug. 24, 2010

(54) PROCESS FOR MANUFACTURING SINGLE-CRYSTAL SEEDS SIMULTANEOUSLY WITH THE CASTING OF SINGLE-CRYSTAL PARTS

(75) Inventors: Umberto Aprile, Rueil Malmaison (FR); Jean-Claude Jacques Giral, Eaubonne (FR); Bernard Louis Lallement, Eaubonne (FR); Jean-Louis Martial Verger, Bondy (FR)

(73) Assignee: SNECMA, Paris (FR)

( * ) Notice: Subject to any disclaimer, the term of this patent is extended or adjusted under 35 U.S.C. 154(b) by 296 days.

(21) Appl. No.: 11/834,893

(22) Filed: Aug. 7, 2007

(65) Prior Publication Data

US 2008/0169076 A1    Jul. 17, 2008

(30) Foreign Application Priority Data

Aug. 29, 2006    (FR) .................................. 06 53510

(51) Int. Cl.
*B22D 25/06* (2006.01)
*B22D 27/20* (2006.01)

(52) U.S. Cl. .................................. 164/122.2

(58) Field of Classification Search ................... 164/15, 164/122, 122.1, 122.2, 125, 361
See application file for complete search history.

(56) References Cited

U.S. PATENT DOCUMENTS 4,475,582 A * 10/1984 Giamei et al. ............. 164/122.2
5,611,389 A *  3/1997 Alessandri et al. ........ 164/122.2

FOREIGN PATENT DOCUMENTS

EP    0 087 379 A1    8/1983
FR    2 724 857 A1    3/1996

* cited by examiner

*Primary Examiner*—Jessica L Ward
*Assistant Examiner*—Kevin E Yoon
(74) *Attorney, Agent, or Firm*—Oblon, Spivak, McClelland, Maier & Neustadt, L.L.P.

(57) ABSTRACT

A process for manufacturing at least one single-crystal seed that can be used as a starter seed in the manufacture of a single-crystal high-pressure turbine nozzle, with at least one vane between two platforms, by metal casting, is disclosed. The process includes producing a wax pattern that includes a pattern for the nozzle, a pattern for the starter seed, and a pattern for a crude seed; forming a ceramic shell mold from the wax pattern; incorporating a starter seed into the mold; pouring metal into the mold; directionally solidifying the metal in the mold from the starter seed; and separating the crude seed from the nozzle. The starter seed and the crude seed each include a flat face for localizing the crystalline orientations. The crude seed has the same crystallographic structure as the nozzle.

11 Claims, 3 Drawing Sheets

PROCESS FOR MANUFACTURING SINGLE-CRYSTAL SEEDS SIMULTANEOUSLY WITH THE CASTING OF SINGLE-CRYSTAL PARTS

BACKGROUND OF THE INVENTION

The present invention relates to the field of manufacturing parts having a directed crystallographic orientation, especially single-crystal parts, by directional solidification of an alloy of cubic crystallographic structure in a shell mold. More particularly, the solidification is carried out from a starter seed.

Directional solidification consists in feeding a mold with molten metal and in making the solidification front advance along a growth axis with a predetermined crystallographic orientation. In nickel superalloys for example, the <001> orientation predominates. However, there are also solidification modes which make it possible for the solidification to be also oriented relative to a plane perpendicular to the primary solidification axis. The crystallographic orientation measured along the principal axis of a cast part is called the primary orientation and the polar orientation in a plane perpendicular to the principal axis is called the transverse or secondary orientation.

The invention applies to single-crystal parts for which it is necessary to respect a <001> primary crystalline orientation.

The invention applies more particularly to single-crystal parts for which two crystalline orientations are to be respected, namely a <001> primary crystalline orientation and an <010> transverse orientation with respect to the solidification axis.

DESCRIPTION OF THE PRIOR ART

When only the <001> primary orientation is to be respected, a single-crystal starter seed with no rotational indexing is used, or else a pigtail or chicane-type crystal selector is used. This is the case when manufacturing HP moving blades in which the airfoil is parallel to the solidification axis. A manufacturing process employing this technique is described in Patent FR 2 734 188 in the name of the Applicant.

If it is desired for both—primary and secondary—crystalline orientations to be respected, a starter seed with rotational indexing is used. This is the case for example for a part such as a single-crystal nozzle manufactured using the process described in Patent FR 2 724 857 in the name of the Applicant, for which the airfoil is transverse with respect to the solidification axis.

In the case of the manufacture of high-pressure turbine nozzles or HPTNs, to respect both crystalline orientations, the starter seed is rotationally indexed during wax pattern mounting by means of a positioning tool or else the entire wax pattern including the starter seed—the grain feed, the HPTN wax pattern and the crude seed are injected molded as one piece in a mold.

The single-crystal seeds normally used in the manufacture of single-crystal turbine nozzles for civil and military aero engines are also manufactured by the lost-wax casting process. The various manufacturing steps consist firstly in manufacturing a wax cluster comprising, as shown in FIG. 1, a starter seed 1, a diaphragm 2 and a rod 3 having the cylindrical shape of the seeds that it is desired to obtain. It is general practice to form the seeds with a flat face 4 in order to orient them in the shell mold for the part and to ensure the crystallographic orientation of the dendrites of the part to be obtained.

The method of manufacturing the seeds is therefore the following. A ceramic shell is produced around the wax pattern comprising the seed, the diaphragm and the rod. This shell is obtained by repeated operations of dipping into a ceramic slip followed by application of layers of sand by immersion in a fluidized bed or by spray coating. After each dipping and ceramic sand application, an interlayer drying operation is carried out. This sequence of operations is repeated several times until the desired thickness of the shell mold is obtained. This then undergoes its final drying operation.

The next step consists in removing the wax from the shell mold and in firing it. It is then ready for casting the alloy. A single-crystal seed is placed in a cylindrical housing provided for this purpose in the base of the ceramic shell and then the latter is placed in the enclosure of a conventional furnace for directional solidification. The metal is poured into the mold and fills the space left by the removal of the wax. The alloy comes into contact with the seed, which partially melts. Solidification then proceeds by pulling. At the end of pulling, a single-crystal rod is obtained. The shell is then knocked off. The rods are cut to the required dimensions and checked so as to confirm the primary and secondary orientations of the seeds obtained. These seeds are available as starter seeds for the manufacture of single-crystal parts, for example turbine nozzles.

This specific manufacture constitutes an additional phase in the production of single-crystal parts, which are already intrinsically complex.

The objective of the invention is to simplify the manufacture of seeds for the purpose of reducing the overall cost of obtaining single-crystal parts.

SUMMARY OF THE INVENTION

According to the invention, this objective is achieved by the following process for manufacturing at least one single-crystal seed that can be used as a starter seed in the manufacture of a single-crystal high-pressure turbine nozzle, with at least one vane between two platforms, by metal casting. This process is distinguished by the fact that:

- a wax pattern is produced which comprises a first element forming the pattern for the nozzle, a second element forming the pattern for the starter seed, including a flat face for localizing the crystalline orientations, and at least a third element incorporating a pattern for the crude seed with a flat face for localizing the crystalline orientations;
- a ceramic shell mold is formed from said wax pattern and a starter seed, including said flat face for localizing the crystalline orientations, is incorporated into the mold; and
- a metal is poured into the mold, the metal undergoes directional solidification in the mold from the starter seed, so that the crude seed obtained has the same crystallographic structure as the part, and the crude seed obtained is separated from the part for subsequent use as a starter seed.

The invention thus allows the manufacture of seeds from the cluster with which one or more single-crystal parts are manufactured, said parts requiring the primary and secondary crystallographic orientations to be respected in mass production. It is therefore no longer necessary to manufacture the seeds separately using a specific shell mold. The number of seeds obtained from such a part may for example be two in the case of the manufacture of a single-crystal turbine nozzle. Since the nozzles are mass-produced, the number of seeds sufficient to manufacture other nozzles is easily achieved. This results in an appreciable cost reduction.

Preferably, for a pattern comprising at least one element for the metal feed gate, the crude seed pattern is incorporated in said element for the metal feed gate forming said third element.

The process thus allows the part produced from the crude seed to be checked by X-ray crystallography. While the crystallographic orientation of the crude seed is being checked, the operations of finishing the single-crystal part may be carried out in parallel. The manufacturing cycle producing the part is therefore shortened. Moreover, using one or more feed gates as crude seeds, it is possible to check the crystallographic orientations of a single-crystal part simply by checking the crude seed obtained in the feed gate.

The invention applies in particular to a pattern comprising an element the forming grain feed between the element forming the starter seed and the first element forming the pattern for the part.

According to one feature, the part is oriented so that the vanes lie along the secondary solidification axis and the platforms along the primary solidification axis. More particularly, the pattern includes two elements forming molten metal feed gates, each incorporating an element forming a crude seed.

According to a first embodiment, the pattern is formed by one-piece injection molding in a mold with wax, providing all of said elements.

According to another embodiment, the pattern is formed by injection molding in a mold with wax, providing the first and second elements, the third element forming the crude seed being produced separately and then attached to the pattern. More particularly in this case, an indexing means is provided between the third element and the pattern.

In particular, the indexing means consists of a link of the mortise-and-tenon type between the pattern and the element forming the crude seed pattern.

Overall, the advantages are the following:

reduction in the costs of obtaining the crude seeds that will be used subsequently as starter seeds; and the crystalline orientation of the parts produced is checked by simply checking the crystalline orientation of the crude seed. It is thus possible to finish the parts in parallel with the checking of the crude seeds, thereby shortening the manufacturing cycle for the part and consequently making a cost saving.

DESCRIPTION OF THE PREFERRED EMBODIMENTS

Figure 1:
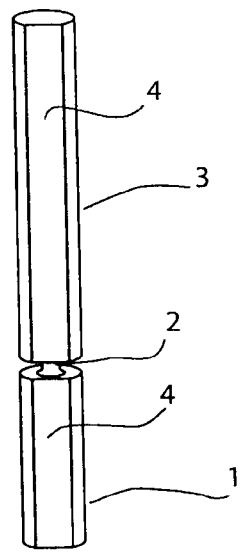
FIG. 1 shows, in perspective, an assembly of the prior art for obtaining single-crystal seeds from a rod.

Among single-crystal parts having a geometry that requires one orientation to be transverse to the solidification axis and/or requires two crystalline orientations to be respected, mention may be made as a characteristic example of HPTNs (high-pressure turbine nozzles). They are manufactured by the lost-wax casting process using starter seeds at the base of the cluster. The invention proposes to use artifices, in other words crude seeds, attached to the product that will become in turn the single-crystal starter seeds.

The process of the invention will be described below by applying it to the manufacture of an HPTN.

One method of manufacturing crude seeds by a one-piece wax injection process is described with reference to FIG. 2.

The first step in the manufacture of the crude seeds simultaneously with HPTNs consists of a one-piece wax injection molding, in a metal mold, of a pattern 10 made up of the following set of elements:

a first element 11, which will form the part, here the HPTN. This HPTN part comprises the two platforms 11A between which a vane 11B extends;

a second element 13, which will mold the starter seed. This element has a flat face 13A by virtue of which the starter seed can be subsequently indexed with respect to the cavity that will mold the part;

two third elements 14, which will form the molten metal feed gates; and a fourth element 15, which will form a grain feed between the starter seed and the part.

In this one-piece pattern 10, it may be seen that the pattern for the part 11 is placed in such a way that the platforms 11A are placed vertically along the <001> primary axis, which is the axis of the starter seed. The starter seed is itself of cylindrical shape, the principal axis of which is the primary solidification axis. The vane 11B is thus oriented along a <010> or <100> transverse crystallographic axis.

The two third elements 14 are shaped so as to be able to disengage therefrom two crude seeds 14A of the same shape as the starter seed. They are cylindrical with a flat face 14A'.

The crude seeds, after solidification of the metal, finishing and inspection, may in turn be used as starters. After several one-piece wax patterns have been obtained, these various patterns are joined together to form a cluster which includes in particular the feed gates and the cup that will hold the metal during casting.

A ceramic shell is therefore produced in a known manner around the wax pattern 10, by alternate operations of dipping the cluster into a ceramic slip followed by applying layers of sand by immersion in a fluidized bed or by spray coating. After each dipping and ceramic sand application, an interlayer drying operation is carried out. This sequence of operations is repeated several times until the desired ceramic thickness of the shell mold is obtained. When the ceramic thickness is sufficient around the wax pattern, the shell thus obtained undergoes its final drying operation.

The wax 10 is then removed from the shell mold, which is then fired. The latter is then ready for casting the alloy.

The shell mold is placed in the enclosure of a conventional furnace for directional solidification, the starter seed having been placed in the cylindrical housing which is provided for this purpose in the base of the ceramic shell and which is produced from the element 13 of the pattern 10.

After being poured, the alloy comes into contact with the seed, which partially melts. Solidification then takes place by pulling or by any other known technique. At the end of solidification, a single-crystal HPTN part and single-crystal crude seeds are obtained in the shell. The shell is then knocked off, and the rods are cut to the required dimensions and checked so as to confirm the primary and secondary orientations of the seeds obtained.

It is considered that the crystallographic orientation of the crude seeds is representative of the HPTN part, thus dispensing with having to check the crystalline orientation of the HPTN. The crude seeds can be used subsequently as starter seeds for the manufacture of single-crystal parts, for example turbine nozzles. The finishing operations, namely those of cutting off the starter seed and the grain feeds, of grinding and of sandblasting, are carried out in parallel with the X-ray crystallographic inspection of the seed, thus making it possible to save time in the overall manufacture of the HPTN part.

According to a variant, it is possible to manufacture the crude seeds without requiring them to be part of a one-piece wax injection molding.

Figure 2:
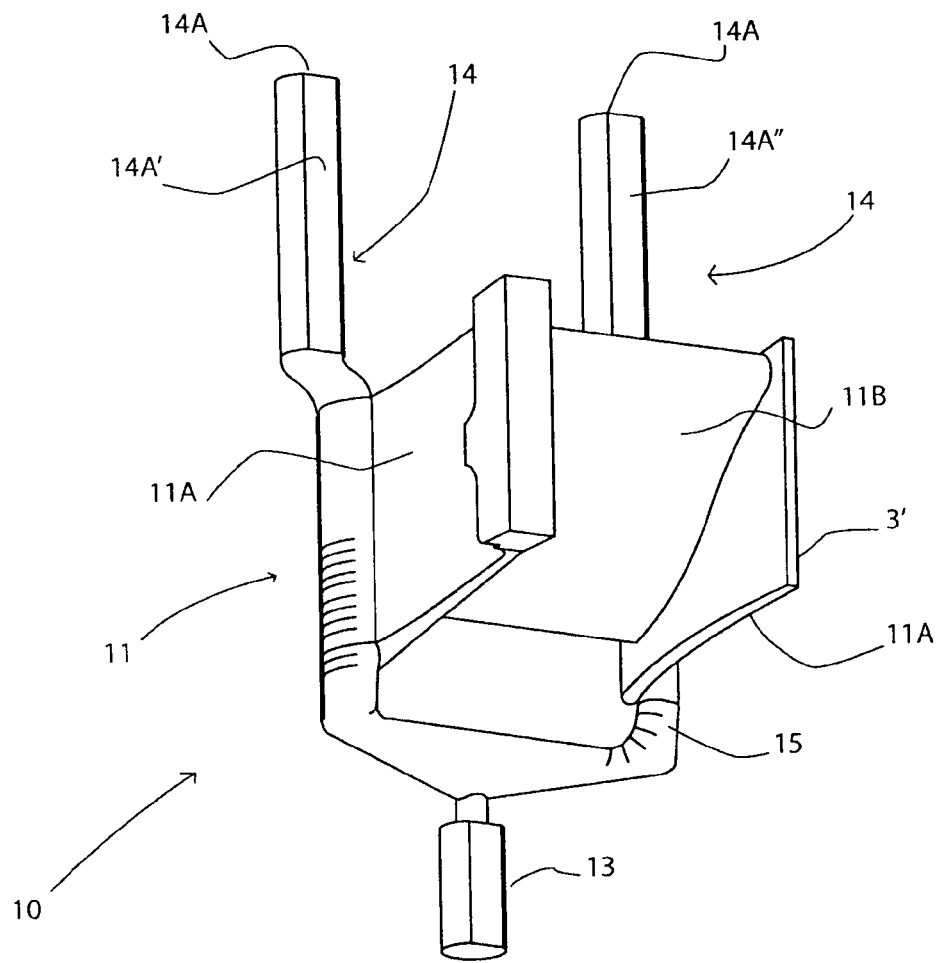
FIG. 2 shows a wax pattern for a single-crystal nozzle according to the invention with two pattern elements forming crude seeds before the shell mold is made up from the pattern.
Figure 3:
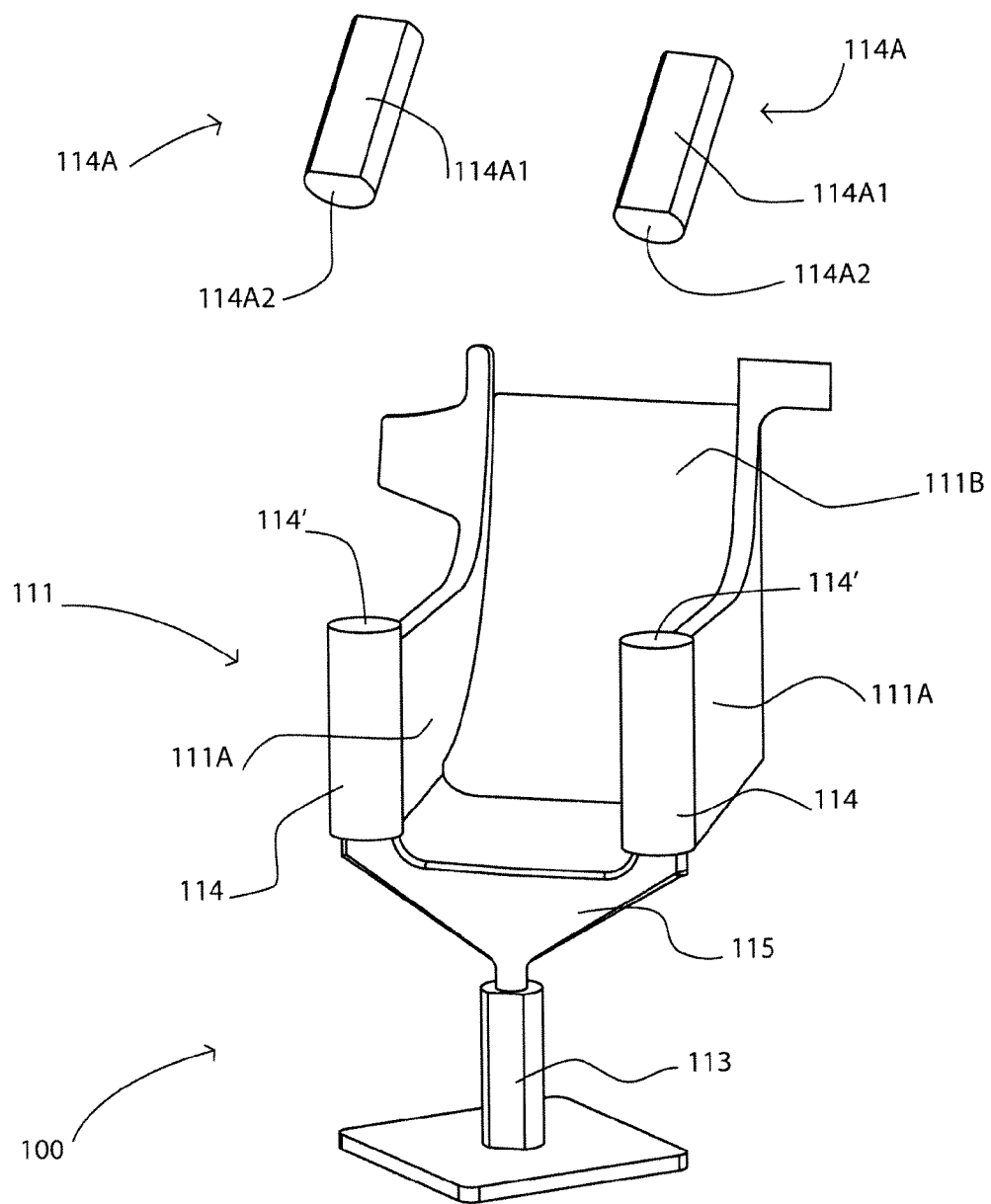
FIG. 3 shows a wax pattern for a single-crystal nozzle according to a variant of the invention in which the crude seeds are assembled by bonding to the nozzle.
Figure 4:
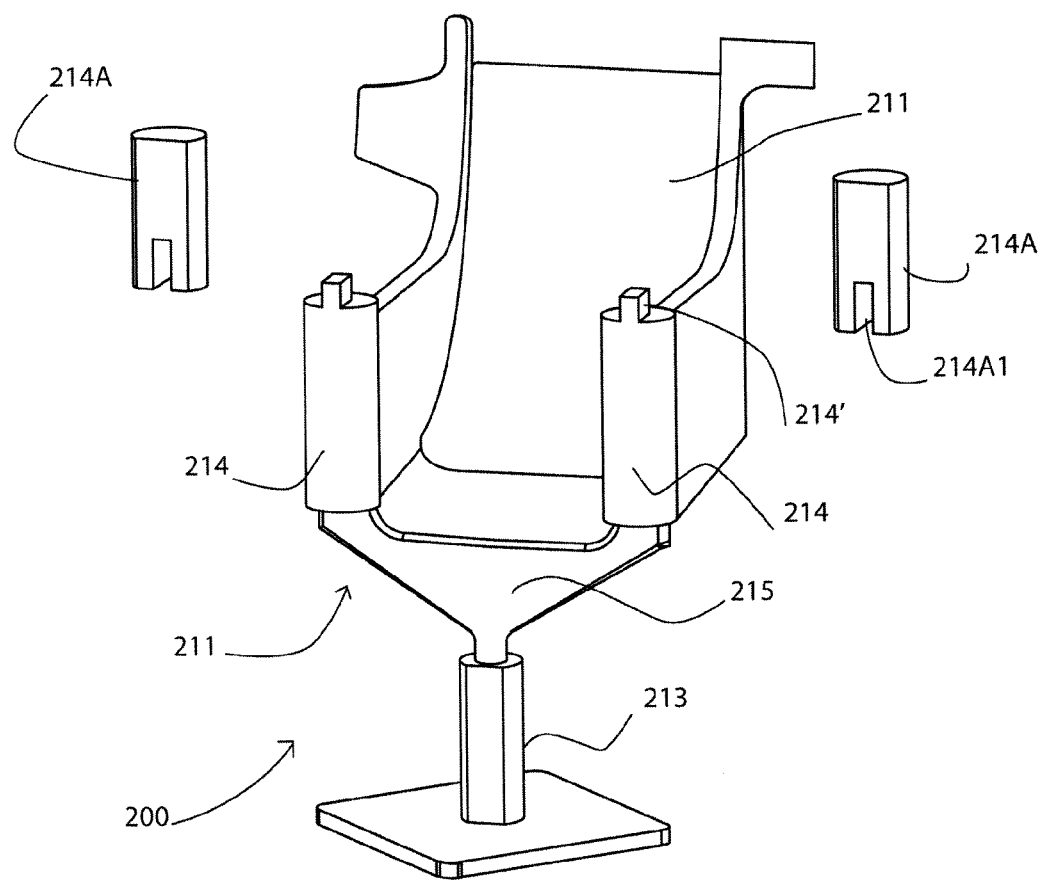
FIG. 4 shows a wax pattern for a single-crystal nozzle according to another variant of the invention in which the crude seeds are assembled by bonding to the nozzle with indexing thanks to a mortise-and-tenon assembly.

This second approach used to produce seeds separately from the injection molding of the one-piece wax pattern is illustrated in FIGS. 3 and 4, in which the corresponding references of FIG. 2 have been increased by 100.

FIG. 3 shows the second element forming the starter seed 113, the fourth element forming the grain feed 115, the HPTN pattern 111 with the platforms 111A and the vane 111B, and the third element for the metal feed gates 114. These elements 114 are injection-molded as one piece with the platforms 111A. The elements forming the crude seeds 114A were manufactured separately in injection-molding molds and are brought in on a positioning tool via which these elements are assembled. Each element forming a crude seed 114A is positioned relative to the part, here an HPTN, being rotationally indexed, thereby orienting the flat face 114A1 and consequently respecting the primary and secondary crystalline orientations of the crude seed. The lower face 114A2 of the wax crude seed patterns is bonded to the upper face 114' of the wax pattern for the portion forming the feed gate for feeding metal into the platform 111A of the part.

A variant of the operating method for the indexing operation is illustrated in FIG. 4 in which the references corresponding to FIG. 3 are the same, but increased by 100. The wax pattern of the crude seed 214A is indexed with respect to the wax pattern 211 and more particularly the feed portion 214 for feeding metal into the part 200 via a link of the mortise-and-tenon type. The wax pattern for the crude seed 214A is provided with a notch 214A1, while the wax pattern for the part 200 is provided with a tenon 214'.

Once assembled, the final wax pattern comprises the same elements as the one-piece pattern of FIG. 2.

For these two variants, the next steps of the process are identical to those of the first solution that described the production of crude seeds from a one-piece injection-molded wax pattern.

The invention claimed is:

1. A process for manufacturing at least one single-crystal seed that can be used as a starter seed in the manufacture of a single-crystal high-pressure turbine nozzle, with at least one vane between two platforms, by metal casting, comprising:
   producing a wax pattern, the wax pattern comprising:
      a first element forming a pattern for the nozzle,
      a second element forming a pattern for the starter seed, including a flat face for localizing crystalline orientations, and at least
      a third element incorporating a pattern for a crude seed with a flat face for localizing the crystalline orientations, wherein the wax pattern is produced by injection molding in a first mold with wax so as to provide the first and second elements, separately producing the third element comprising a crude seed pattern by injection molding in a second mold with wax, and attaching the second mold to the first mold;
   forming a ceramic shell mold from said wax pattern;
   incorporating the starter seed into the mold, the starter seed including said flat face for localizing the crystalline orientations;
   pouring a metal into the mold;
   directionally solidifying the metal in the mold from the starter seed, so that the crude seed obtained has the same crystallographic structure as the nozzle; and
   separating the obtained crude seed from the nozzle for subsequent use as a starter seed.

2. The process as claimed in claim 1, wherein the wax pattern includes a fourth element which forms a grain feed between the second element and the first element.

3. The process as claimed in claim 2, wherein the nozzle is oriented so that the vanes lie along the secondary axis and the platforms along the primary axis.

4. The process as claimed in claim 3, wherein the wax pattern includes first and second third elements which form molten metal feed gates, each of the first and second third elements incorporating an element which forms a crude seed pattern.

5. The process as claimed in claim 1, wherein an indexing means is provided between the third element and the pattern comprising the first and second elements.

6. The process as claimed in claim 5, wherein the indexing means comprises a link of the mortise-and-tenon type between the third element forming the crude seed pattern and the pattern comprising the first and second elements.

7. The process as claimed in claim 1, further comprising checking the nozzle by X-ray crystallography inspection of the crude seed.

8. The process as claimed in claim 1, wherein the pattern for the crude seed is an uppermost portion of the mold.

9. The process as claimed in claim 4, wherein the first third element and the second third element are separate from each other.

10. The process as claimed in claim 1, wherein a shape of the obtained crude seed and a shape of the starter seed is the same.

11. The process as claimed in claim 7, wherein finishing operations are performed in parallel with the X-ray crystallographic inspection of the crude seed.

* * * * *